(12) United States Patent
Guan et al.

(10) Patent No.: US 12,355,274 B2
(45) Date of Patent: Jul. 8, 2025

(54) DEVICES AND METHODS FOR POSITION DETECTION BY A 3D MAGNETIC FIELD SENSOR

(71) Applicant: Infineon Technologies AG, Neubiberg (DE)

(72) Inventors: Lifeng Guan, Singapore (SG); Wai Keung Frankie Chan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 17/836,211

(22) Filed: Jun. 9, 2022

(65) Prior Publication Data
US 2022/0399762 A1 Dec. 15, 2022

(30) Foreign Application Priority Data
Jun. 10, 2021 (DE) .................. 102021114974.6

(51) Int. Cl.
| | |
|---|---|
| *H02J 50/90* | (2016.01) |
| *G01R 33/02* | (2006.01) |
| *H02J 7/00* | (2006.01) |
| *H02J 50/10* | (2016.01) |
| *H02J 50/40* | (2016.01) |
| *H04R 1/10* | (2006.01) |

(52) U.S. Cl.
CPC .......... *H02J 50/90* (2016.02); *G01R 33/0206* (2013.01); *H02J 7/0044* (2013.01); *H02J 50/10* (2016.02); *H02J 50/40* (2016.02); *H04R 1/1016* (2013.01); *H04R 1/1025* (2013.01); *H04R 1/1041* (2013.01); *H04R 2420/07* (2013.01)

(58) Field of Classification Search
CPC . H02J 50/90; H02J 50/10; H02J 50/40; G01R 33/0206; H04R 1/1016; H04R 1/1025; H04R 1/1041; H04R 2420/07
See application file for complete search history.

(56) References Cited

U.S. PATENT DOCUMENTS

| | | | |
|---|---|---|---|
| 9,975,634 B2 | 5/2018 | Von Novak, III et al. | |
| 2014/0347045 A1* | 11/2014 | Paul | G01R 33/07 324/251 |
| 2015/0081246 A1* | 3/2015 | Schaaf | G01B 7/00 702/150 |
| 2017/0093079 A1* | 3/2017 | Wagman | H04R 1/1075 |
| 2017/0094399 A1* | 3/2017 | Chandramohan | H04R 1/345 |
| 2017/0191851 A1* | 7/2017 | Hill | G01D 5/14 |

(Continued)

FOREIGN PATENT DOCUMENTS

| | | |
|---|---|---|
| DE | 102010003292 A1 | 9/2011 |
| DE | 102013209514 A1 | 11/2014 |

(Continued)

*Primary Examiner* — Paresh Patel
(74) *Attorney, Agent, or Firm* — Harrity & Harrity, LLP

(57) ABSTRACT

A device includes a first electronic component and a case, wherein the case includes a first charging compartment configured to accommodate and charge the first electronic component. The device further includes a first magnet included in the first electronic component and a 3D magnetic field sensor included in the case. The device further includes a detection unit configured to detect a position of the first electronic component relative to the first charging compartment based on a magnetic field sensed by the 3D magnetic field sensor.

24 Claims, 4 Drawing Sheets

(56) References Cited

U.S. PATENT DOCUMENTS

2021/0063499 A1 3/2021 Ding et al.
2021/0278245 A1* 9/2021 Degois ................... G01D 5/145

FOREIGN PATENT DOCUMENTS

| DE | 102015107221 A1 | 11/2016 |
| DE | 102016110968 A1 | 12/2017 |
| EP | 3570557 A1 | 11/2019 |

* cited by examiner

DEVICES AND METHODS FOR POSITION DETECTION BY A 3D MAGNETIC FIELD SENSOR

RELATED APPLICATION

This application claims priority to German Patent Application No. 102021114974.6, filed on Jun. 10, 2021, which is incorporated herein by reference in its entirety.

FIELD

The present disclosure relates to devices and methods for position detection by a 3D magnetic field sensor.

BACKGROUND

In many applications electronic components may be charged in charging compartments of a case. Here, a condition may have to be implemented as to when a charging process of an electronic component is to be started. For example, a pair of earbuds (or earphones) may be charged in a charging case including a charging compartment for each of the earbuds. A charging process may be initiated when sensing pins of the charging case detect that the earbuds are properly placed in the charging socket. Manufacturers of the described device types are constantly striving to improve their products. In particular, it may be desirable to provide a simple and efficient charging feature for the devices.

SUMMARY

An aspect of the present disclosure relates to a device. The device includes a first electronic component and a case, wherein the case includes a first charging compartment configured to accommodate and charge the first electronic component. The device further includes a first magnet included in the first electronic component and a 3D magnetic field sensor included in the case. The device further includes a detection unit configured to detect a position of the first electronic component relative to the first charging compartment based on a magnetic field sensed by the 3D magnetic field sensor.

An aspect of the present disclosure relates to a method. The method includes sensing, by a 3D magnetic field sensor included in a case, a magnetic field generated by a magnet included in an electronic component. The method further includes, based on the sensed magnetic field, detecting a position of the electronic component relative to a charging compartment of the case, wherein the charging compartment is configured to accommodate and charge the electronic component.

BRIEF DESCRIPTION OF THE DRAWINGS

Devices and methods in accordance with the disclosure are described in more detail below based on the drawings. Like reference signs may designate corresponding similar parts.

DETAILED DESCRIPTION

Figure 1A:
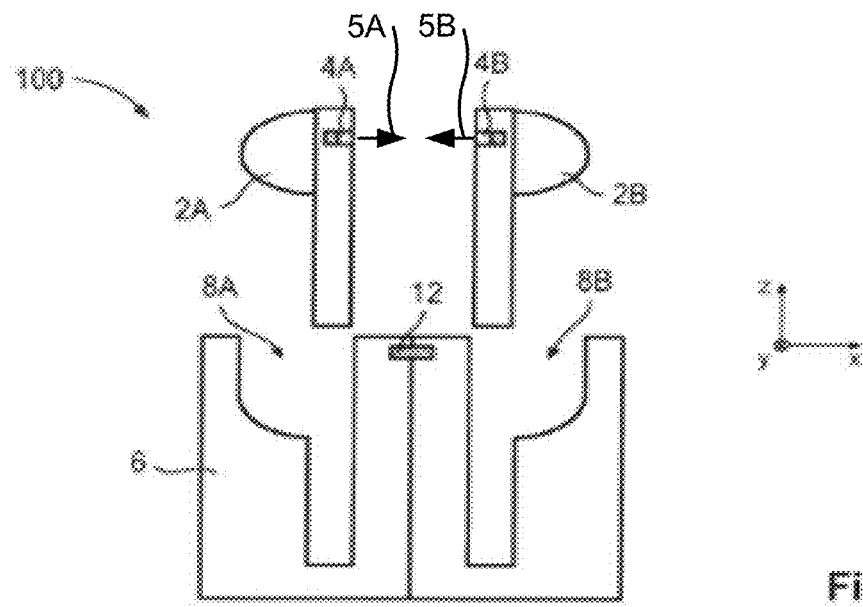
FIGS. 1A to 1C illustrate various views of a device 100 in accordance with the disclosure.
Figure 1B:
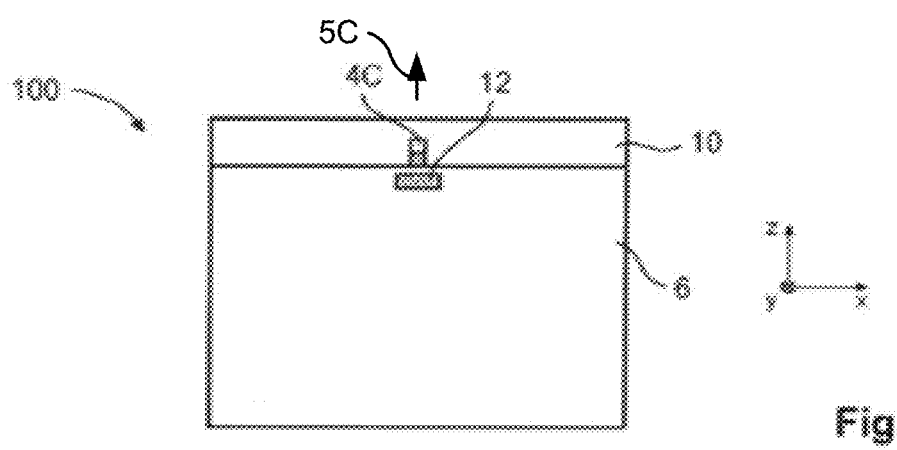
Figure 1C:
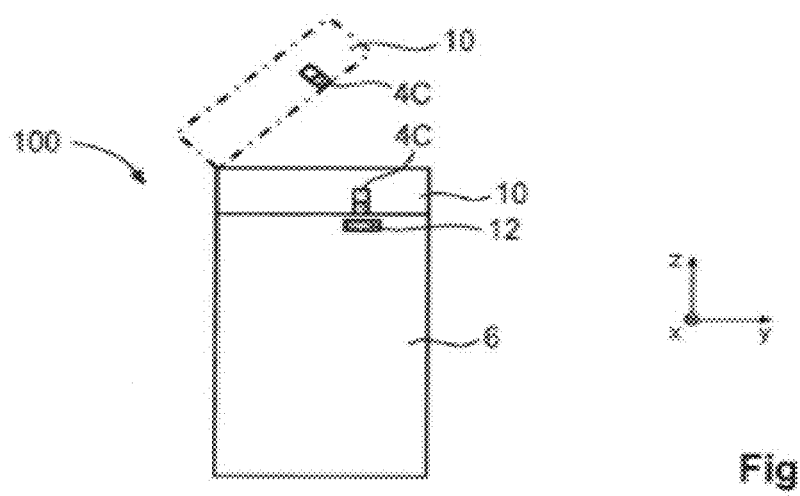

FIG. 1A illustrates a cross-sectional side view of the device 100, while FIGS. 1B and 1C illustrate different side views of the device 100. The device 100 may include a first electronic component 2A and a second electronic component 2B. In particular, the electronic components 2A and 2B may be wireless components. In the example of FIGS. 1A-1C, each of the electronic components 2A and 2B may correspond to a wireless earbud, more particular to a true wireless earbud. The electronic components 2A and 2B may include a first magnet 4A and a second magnet 4B, respectively. The device 100 may further include a case 6 having a first charging compartment 8A and a second charging compartment 8B. The case 6 may further include a case cover 10 configured to cover the interior of the case 6 in a closed state. A third magnet 4C may be included in the case cover 10. FIGS. 1B and 1C illustrate the case cover 10 in a closed state. In addition, the dashed rectangle in FIG. 1C illustrates the case cover 10 in an open state.

Each of the charging compartments 8A and 8B may be configured to accommodate one of the electronic components 2A and 2B. In the example of FIG. 1A, the electronic components 2A and 2B are located outside of the charging compartments 8A and 8B for illustrative purposes. Furthermore, each of the charging compartments 8A and 8B may be configured to (in particular wirelessly) charge the associated electronic component when arranged in the charging compartment. A charging process may be initiated if an arrangement of an electronic component in a charging compartment is detected. In this regard, wireless charging may be performed in any suitable manner. For example, the case 6 and the electronic components 2A and 2B may each include one or more coils. A coil in the case 6 may transform an electric current into a magnetic field. The magnetic field may be converted back into electric currents in the coils of the electronic components 2A and 2B such that the electronic components 2A and 2B may be supplied with power simply by being arranged in the charging compartments 8A and 8B.

In the example of FIGS. 1A-1C, the magnets 4A to 4C may correspond to small bar magnets. When the first electronic component 2A is arranged in the first charging compartment 8A, the magnetization direction 5A of the first magnet 4A may extend along the x-direction. In a similar fashion, when the second electronic component 2B is arranged in the second charging compartment 8B, the magnetization direction 5B of the second magnet 4B may extend along the x-direction. The magnetization direction 5A of the first magnet 4A may then be opposite to the magnetization direction 5B of the second magnet 4B. In a closed state of the case cover 10, a magnetization direction 5C of the third magnet 4C may be perpendicular to each of the magnetization directions 5A and 5B of the first magnet 4A and the second magnet 4B.

The device 100 may further include a 3D magnetic field sensor 12 included in the case 6. The 3D magnetic field sensor 12 may be configured to sense the strengths of a magnetic field in all three spatial dimensions, i.e. with respect to the x-, y- and z-axis. Accordingly, the 3D magnetic field sensor 12 may be configured for contactless position sensing for three-dimensional magnetic movements. For example, the 3D magnetic field sensor 12 may be a hall-based sensor. In addition, the 3D magnetic field sensor 12 may be a linear sensor, i.e. configured to measure a magnetic field and output a signal that is directly proportional to the measured magnetic field.

The device 100 may further include a detection unit (not illustrated). The detection unit may be electrically connected to the 3D magnetic field sensor 12 for receiving sensing signals generated by the 3D magnetic field sensor 12. The detection unit may be configured to detect a position of the first electronic component 2A relative to the first charging compartment 8A based on a magnetic field sensed by the 3D magnetic field sensor 12. In a similar fashion, the detection unit may be configured to detect a position of the second electronic component 2B relative to the second charging compartment 8B based on a magnetic field sensed by the 3D magnetic field sensor 12. The detection unit may be included in the case 6. For example, the detection unit may include or may correspond to an integrated circuit included in the case 6.

FIGS. 2A-2D, 3A-3B, and 4A-4B illustrate a position detection for the electronic components 2A, 2B and the case cover 10 based on a magnetic field sensed by the 3D magnetic field sensor 12. The simulation results of FIGS. 2A-2D, 3A-3B, and 4A-4B are based on the following setup. The magnets 4A and 4B included in the electronic components 2A and 2B are horizontally oriented. The third magnet 4C included in the case cover 10 is oriented vertically when the case cover 10 is closed. When viewed in the z-direction, the 3D magnetic field sensor 12 is arranged right below the third magnet 4C when the case cover 10 is closed. When the first electronic component 2A is arranged in the first charging compartment 8A, the first magnet 4A is located 5 mm away from the 3D magnetic field sensor 12 in the positive y-direction and located 5 mm away from the 3D magnetic field sensor 12 in the negative x-direction. When the second electronic component 2B is arranged in the second charging compartment 8B, the second magnet 4B is located 5 mm away from the 3D magnetic field sensor 12 in the positive y-direction and located 5 mm away from the 3D magnetic field sensor 12 in the positive x-direction.

FIGS. 2A to 2D illustrate simulation results for magnetic field components based on a movement of the case cover 10 for different scenarios. In particular, FIGS. 2A to 2D relates to an act of opening or closing the case cover 10. The magnetic field components $B_x$ (see thick solid line), $B_y$ (see dashed line) and $B_z$ (see dotted line) in units of mT are plotted against a distance between the third magnet 4C and the 3D magnetic field sensor 12. At a distance of zero, the case cover 10 is in a closed state.

Figure 2A:
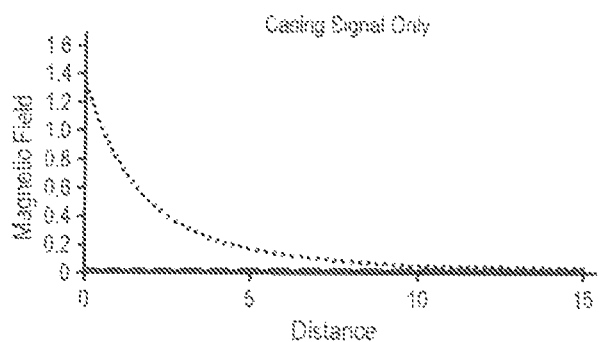
FIGS. 2A to 2D illustrate simulation results for magnetic field components based on a movement of a case cover for different scenarios.

FIG. 2A relates to a scenario of detecting the position of the case cover 10 when the electronic components 2A and 2B are not present. The detection unit may be configured to detect a position of the case cover 10 based on the $B_z$-component. When closing the case cover 10, the third magnet 4C moves towards the 3D magnetic field sensor 12. The strength of the $B_z$-component increases with decreasing distance and reaches a maximum value when the case cover 10 is closed. The detection unit may be configured to detect the closed state or an open state of the case cover 10 by comparing the $B_z$-component with one or more threshold values. In the example of FIG. 2A, a closed state of the case cover 10 may be detected if the $B_z$-component is greater than a predetermined threshold value (e.g. 1.2). In a similar fashion, an open state of the case cover 10 may be detected when the $B_z$-component is smaller than the predetermined threshold value. In FIG. 2A, each of the $B_x$-component and the $B_y$ is zero.

Figure 2B:
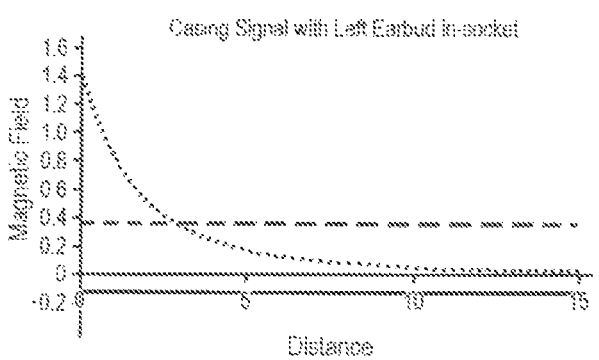

FIG. 2B relates to a scenario of detecting the position of the case cover 10 when the first electronic component 2A is arranged in the first charging compartment 8A. The curve of the $B_z$-component in FIG. 2B is similar to the one of FIG. 2A. Accordingly, the detection unit may be configured to detect a position of the case cover 10 based on the $B_z$-component similar to FIG. 2A. Each of the $B_x$-component and the $B_y$-component has a constant non-zero value.

Figure 2C:
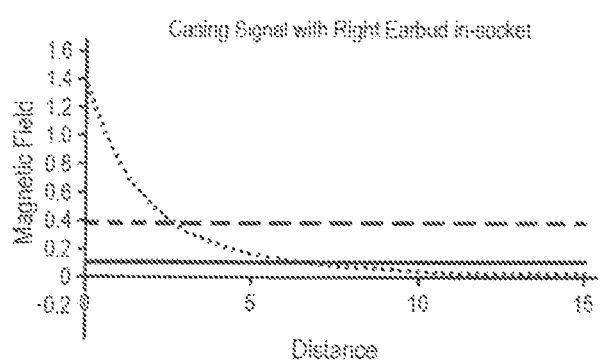

FIG. 2C relates to a scenario of detecting the position of the case cover 10 when the second electronic component 2B is arranged in the second charging compartment 8B. The curve of the $B_z$-component in FIG. 2C is similar to the one of FIG. 2A. Each of the $B_x$-component and the $B_y$ has a constant non-zero value.

Figure 2D:
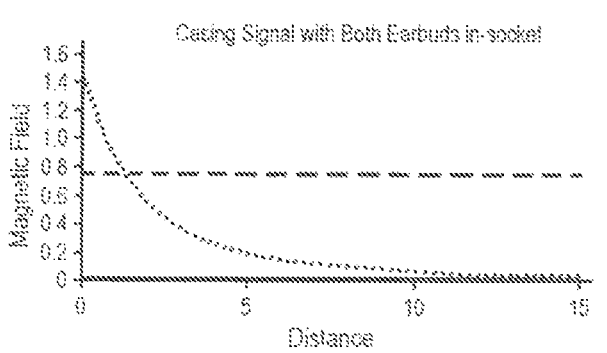

FIG. 2D relates to a scenario of detecting the position of the case cover 10 when the first electronic component 2A is arranged in the first charging compartment 8A and the second electronic component 2B is arranged in the second charging compartment 8B. The curve of the $B_z$-component in FIG. 2D is similar to the one of FIG. 2A. The $B_y$ has a constant non-zero value while the $B_x$-component is zero.

FIGS. 3A-3B and 4A-4B illustrate simulation results for magnetic field components and an arctangent function of magnetic field components based on various movements of the electronic components 2A and 2B for different scenarios.

Figure 3A:
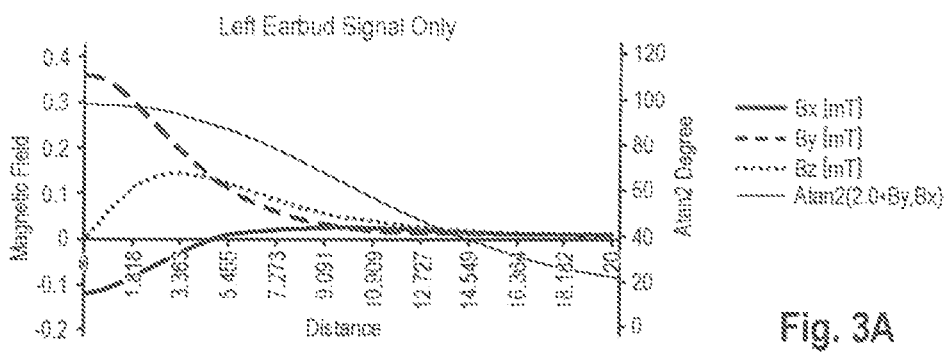
FIGS. 3A and 3B illustrate simulation results for magnetic field components and an arctangent function of magnetic field components based on a movement of a first electronic component for different scenarios.
Figure 3B:
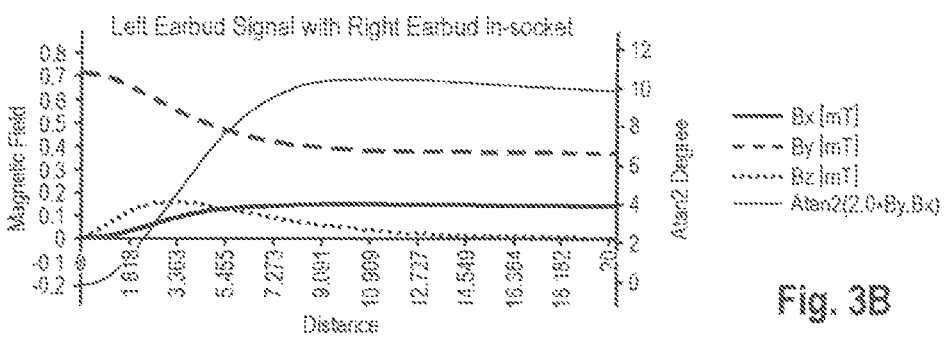

FIG. 3A relates to a scenario of detecting the position of the first electronic component 2A when the second electronic component 2B is not present and the case cover 10 is open. FIG. 3B relates to a scenario of detecting the position of the first electronic component 2A when the second electronic component 2B is arranged in the second charging compartment 8B and the case cover 10 is open.

Figure 4A:
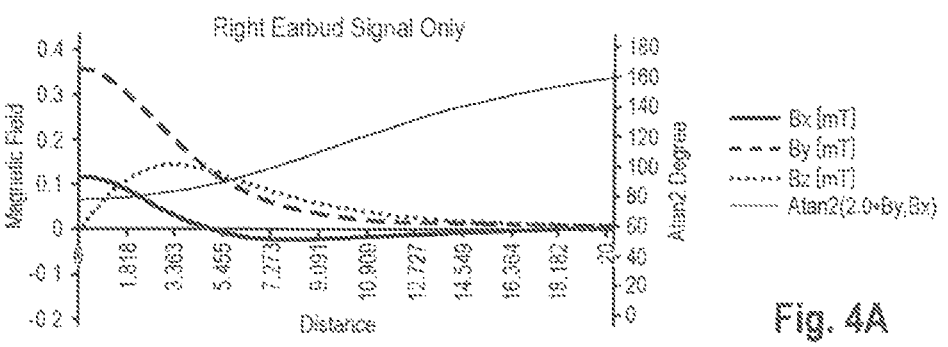
FIGS. 4A and 4B illustrate simulation results for magnetic field components and an arctangent function of magnetic field components based on a movement of a second electronic component for different scenarios.
Figure 4B:
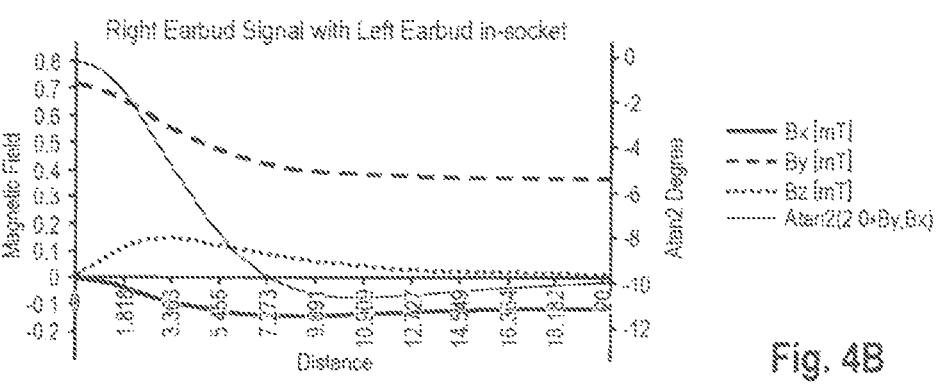

FIG. 4A relates to a scenario of detecting the position of the second electronic component 2B when the first electronic component 2A is not present and the case cover 10 is open. FIG. 4B relates to a scenario of detecting the position of the second electronic component 2B when the first electronic component 2A is arranged in the first charging compartment 8A and the case cover 10 is open.

In FIGS. 3A-3B and 4A-4B, the magnetic field components $B_x$ (see thick solid line), $B_y$ (see dashed line) and $B_z$ (see dotted line) in units of mT and an arctangent function (see thin solid line) in units of degree are plotted against a distance between the respective one of the magnets 4A, 4B and the 3D magnetic field sensor 12. The arctangent function may depend on the $B_x$-component and the $B_y$-component. In particular, the arctangent function may correspond to atan $2(2B_y, B_x)$. At a distance of zero, the respective electronic component is arranged in the associated charging compartment.

The detection unit of the device 100 may be configured to detect an arrangement of the electronic components 2A and 2B in the charging compartments 8A and 8B. In this connection, the detection unit may be configured to compare detected values of the magnetic field components and the arctangent function with values that have been stored in a memory or register based on a calibration process of the device 100. In particular, the device 100 may have been calibrated for each of the scenarios shown in FIGS. 2A-2D, 3A-3B, and 4A-4B. If an arrangement of an electronic component in a charging compartment is detected, a charging process of the electronic component may be initiated. Conversely, a charging process of an electronic component may be stopped if it is detected that it has been removed from a charging compartment. In addition, based on the detected positions of the electronic components, it may be determined when to start a pairing between the electronic components and another electronic device (e.g. a mobile phone) and/or when to send signals to the paired electronic device in order to activate further functionalities. A position of an electronic component may be determined based on the data provided by FIGS. 2A-2D, 3A-3B, and 4A-4B in various ways. In the following, some exemplary, but non-limiting, detection features are discussed.

The detection unit may be configured to detect the position of at least one of the electronic components 2A and 2B based on the $B_x$-component and the $B_y$-component. More particular, the detection unit may be configured to detect the position of at least one of the electronic components 2A and 2B based on an arctangent function of the $B_x$-component and the $B_y$-component, such as e.g. atan $2(2B_y, B_x)$. And even more particular, the detection unit may be configured to detect the position of at least one of the electronic components 2A and 2B by comparing the arctangent function with a threshold value. For example, when a negative value of the arctangent function is detected, the detection unit may be configured to determine that the device 100 is in the scenario of FIG. 4B. This is because the arctangent function does not include negative values in any other scenario. In FIG. 4B, the values of the arctangent function range from about 0 to about −10, and at a distance of 0, the arctangent function has a value of about 0. Thus, if the value of the arctangent function is negative, but greater than a threshold value of e.g. about −1, the detection unit may be configured to detect that the second electronic component 2B is getting inserted in the second charging compartment 8B.

The detection unit may be configured to detect the position of at least one of the electronic components 2A and 2B based on a magnetic field component and an arctangent function of two magnetic field components. More particular, the detection unit may be configured to detect the position of at least one of the electronic components 2A and 2B based on the $B_y$-component and the arctangent function atan $2(2B_y, B_x)$. For example, if a value of the $B_y$-component is greater than e.g. 0.6, the detection unit may be configured to determine that the device 100 is in one of the scenarios of FIGS. 3B and 4B. That is, the detection unit may determine that one of the electronic components 2A and 2B is arranged in a charging compartment and the other electronic component is inserted (or getting inserted) in the other charging compartment. A distinction between the scenarios of FIGS. 3B and 4B may then be made by taking further into account the value of the arctangent function. If the value of the arctangent function is positive, the detection unit may determine that the device 100 is in the scenario of FIG. 3B. Conversely, if the value of the arctangent function is negative, the detection unit may determine that the device 100 is in the scenario of FIG. 4B.

The detection unit may be configured to detect the position of at least one of the electronic components 2A and 2B based on an arctangent function of two magnetic field components and a derivative of the arctangent function. More particular, the detection unit may be configured to detect the position of at least one of the electronic components 2A and 2B based on the arctangent function atan $2(2B_y, B_x)$ and its derivative. For example, if a value of the arctangent function is greater than e.g. 80, the detection unit may determine that the device 100 is in one of the scenarios of FIGS. 3A and 4A. That is, the detection unit may determine that one of the electronic components 2A and 2B is inserted (or getting inserted) in a charging compartment and the other electronic component is not present. A distinction between the scenarios of FIGS. 3A and 4A may then be made by taking further into account the value of the derivative of the arctangent function. If the value of the derivative of the arctangent function is negative, the detection unit may determine that the device 100 is in the scenario of FIG. 3A. Conversely, if the value of the derivative of the arctangent function is positive, the detection unit may determine that the device 100 is in the scenario of FIG. 4A.

In the previous examples, position detection is discussed based on the magnetic field components $B_x$, $B_y$, $B_z$ and an arctangent function. In a further example, a calculation unit (not illustrated) of the device 100 may be configured to calculate a 3D magnetic field vector of the sensed magnetic field. The 3D magnetic field vector may be based on Cartesian coordinates or spherical coordinates. For example, the calculation of the 3D magnetic field vector may be based on sensed magnetic field components $B_x$, $B_y$ and $B_z$. For example, the calculation unit may be included in the case 6. The detection unit may be configured to detect the position of at least one of the electronic components 2A and 2B based on the calculated 3D magnetic field vector. For this purpose, a mapping between 3D magnetic field vectors and one or more of the scenarios shown in FIGS. 2A-2D, 3A-3B, and 4A-4B may be used.

It is to be noted that the relative arrangements between the magnets 4A, 4B, 4C and the 3D magnetic field sensor 12 in the previous examples are exemplary and may differ in further examples. In particular, an implementation of the magnetization directions, used detection thresholds and the relative positions between the magnets 4A, 4B, 4C and the 3D magnetic field sensor 12 may be interrelated and may need a holistic consideration in a real design of a device in accordance with the disclosure. In addition, while position detection has been previously discussed in connection with mutually perpendicular $B_x$-, $B_y$- and $B_z$-components, in a more general view, position detection may be based on linearly independent magnetic field components.

In the previous examples, position detection is discussed for an exemplary number of two electronic components 2A and 2B. However, position detection in accordance with the disclosure may not necessarily be restricted to a number of two electronic components. In a further example, a device in accordance with the disclosure may include only one electronic component. In yet further examples, position detection of previous examples may also be extended to devices including more than two electronic components.

In the example of FIG. 1, each of the electronic components 2A and 2B may correspond to a wireless earbud. However, in further examples an electronic component may not be restricted to a specific type. In particular, an electronic component may include one of a smart device, a wearable computing device, or a consumer electronics device. In one example, an electronic component may correspond to a handheld health device, such as e.g. a smart heartbeat monitor configured to sense the heart rate of a person or an oxygen clip configured to sense the blood oxygen level of a person. In a further example, the electronic component may correspond to an AR (Augmented Reality)-component, such as e.g. AR goggles or one or more wireless lenses included therein. In yet further examples, an electronic component may be one of a handheld sensor device, a stage microphone, a wireless ultrasound probe, a wearable camera, etc. In particular, an electronic component as described herein may be wireless.

As previously described, position detection in accordance with the disclosure may be based on one or more detection threshold values. In one example, the detection unit may be configured to adapt one or more of the detection threshold values based on occurring external or device-internal conditions, such as e.g. a degradation of at least one of the magnets 4A to 4C over time, or a change of a temperature of the device. In this regard, the 3D magnetic field sensor 12 may be configured to sense a temperature of the sensor die. In addition, sensed magnetic field values may be stored and compared over time in order to detect a degradation of the magnets 4A to 4C.

Other devices, different from those previously described, may use multiple magnetic sensors (in particular switches) arranged in the charging case as well as magnets arranged in the earbuds and in the case cover. The magnets in the earbuds and in the case cover may activate the respective magnetic switch when moving close to the magnetic switch. Since multiple switches are used, cables running between the switches and a PCB of the device may increase the complexity of the mechanical design, the production design and the assembly process design. In contrast to this, devices in accordance with the disclosure may simplify a contactless approach by reducing the number of multiple magnetic switches to only one single 3D magnetic field sensor in order to avoid a complicated mechanical construction/design and therefore reduce the production costs.

Other devices, different from those previously described, may use spring contacts and/or contact pins for establishing a connection between the charging case and the earbuds. Here, the spring contacts and/or the contact pins may suffer from aging effects, environmental factors and mechanical stress applied to the spring contacts and/or the contact pins which may lead to a worse connection between the charging case and the earbuds. In contrast to this, the contactless approach in accordance with the disclosure may overcome such contact degradation issues.

Figure 5:
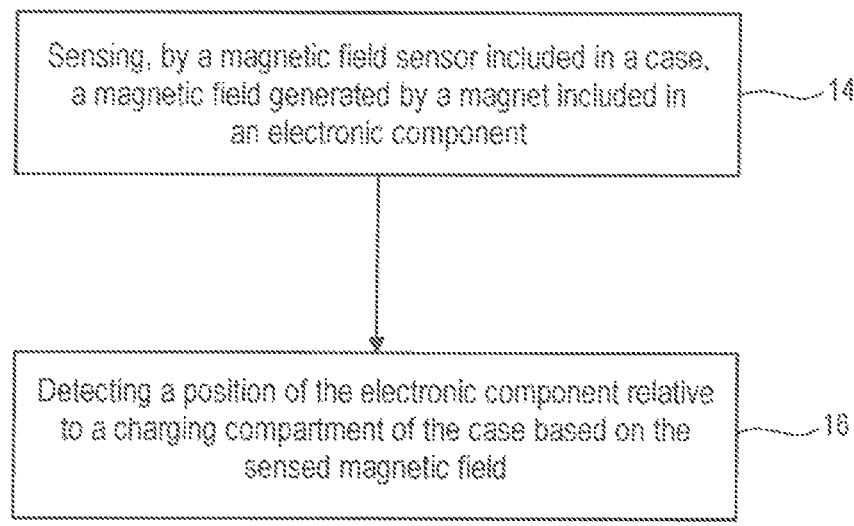
FIG. 5 illustrates a flow chart of a method in accordance with the disclosure.

FIG. 5 illustrates a flow chart of a method in accordance with the disclosure. For example, the method may be used for operating a device in accordance with the disclosure as described herein. The method may thus be read in connection with any of the foregoing figures.

At 14, a magnetic field generated by a magnet included in an electronic component is sensed by a 3D magnetic field sensor included in a case. At 16, a position of the electronic component relative to a charging compartment of the case is detected based on the sensed magnetic field. The charging compartment is configured to accommodate and charge the electronic component.

EXAMPLES

In the following, devices and methods in accordance with the disclosure are explained by means of examples.

Example 1 is a device, comprising: a first electronic component; a case, wherein the case comprises a first charging compartment configured to accommodate and charge the first electronic component; a first magnet included in the first electronic component; a 3D magnetic field sensor included in the case; and a detection unit configured to detect a position of the first electronic component relative to the first charging compartment based on a magnetic field sensed by the 3D magnetic field sensor.

Example 2 is a device according to Example 1, further comprising: a second electronic component; a second charging compartment included in the case and configured to accommodate and charge the second electronic component; and a second magnet included in the second electronic component, wherein the detection unit is configured to detect a position of the second electronic component relative to the second charging compartment based on the sensed magnetic field.

Example 3 is a device according to Example 1 or 2, wherein the detection unit is configured to: detect an arrangement of at least one of the electronic components in at least one of the charging compartments, and to initiate a charging process of at least one of the electronic components if the arrangement is detected.

Example 4 is a device according to one of the preceding Examples, wherein the detection unit is configured to detect the position of at least one of the electronic components based on: a first magnetic field component of the sensed magnetic field, and a second magnetic field component of the sensed magnetic field linearly independent from the first magnetic field component.

Example 5 is a device according to Example 4, wherein the detection unit is configured to detect the position of at least one of the electronic components based on: comparing an arctangent function of the first magnetic field component and the second magnetic field component with a first threshold value.

Example 6 is a device according to Example 4 or 5, wherein the detection unit is configured to detect the position of at least one of the electronic components based on: the second magnetic field component, and an arctangent function of the first magnetic field component and the second magnetic field component.

Example 7 is a device according to one of Examples 4 to 6, wherein the detection unit is configured to detect the position of at least one of the electronic components based on: an arctangent function of the first magnetic field component and the second magnetic field component, and a derivative of the arctangent function.

Example 8 is a device according to one of Examples 5 to 7, wherein: the arctangent function is atan $2(2B_y, B_x)$, $B_x$ is the first magnetic field component, and $B_y$ is the second magnetic field component.

Example 9 is a device according to one of the preceding Examples, further comprising: a calculation unit configured to calculate a 3D magnetic field vector of the sensed magnetic field.

Example 10 is a device according to Example 9, wherein the detection unit is configured to detect the position of at least one of the electronic components based on the calculated 3D magnetic field vector.

Example 11 is a device according to one of the preceding Examples, further comprising: a case cover configured to cover the interior of the case; and a third magnet included in the case cover.

Example 12 is a device according to Example 11, wherein the detection unit is configured to detect a position of the case cover based on a single third magnetic field component of the sensed magnetic field.

Example 13 is a device according to Example 12 and Example 4, wherein the third magnetic field component is linearly independent from the first magnetic field component and the second magnetic field component.

Example 14 is a device according to Example 12 or 13, wherein the detection unit is configured to detect a closed state or open state of the case cover based on comparing the third magnetic field component with a second threshold value.

Example 15 is a device according to one of Examples 2 to 14, wherein, when the electronic components are arranged in the charging compartments, a first magnetization direction of the first magnet is opposite to a second magnetization direction of the second magnet.

Example 16 is a device according to Example 15 and Example 12, wherein, in a closed state of the case cover, a third magnetization direction of the third magnet is perpendicular to each of the first magnetization direction and the second magnetization direction.

Example 17 is a device according to one of the preceding Examples, wherein at least one of the charging compartments is configured to wirelessly charge at least one of the electronic components.

Example 18 is a device according to one of the preceding Examples, wherein at least one of the electronic components includes a wireless earbud.

Example 19 is a device according to one of the preceding Examples, wherein at least one of the electronic components includes one of a smart device, a wearable computing device, or a consumer electronics device.

Example 20 is a device according to one of the preceding Examples, wherein the detection unit is configured to adapt a detection threshold value based on at least one of: a degradation of at least one of the magnets over time, or a change of a temperature of the device.

Example 21 is a method, comprising: sensing, by a 3D magnetic field sensor included in a case, a magnetic field generated by a magnet included in an electronic component; and based on the sensed magnetic field, detecting a position of the electronic component relative to a charging compartment of the case, wherein the charging compartment is configured to accommodate and charge the electronic component.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference of the description. It is therefore intended that the appended claims encompass any such modifications or embodiments.

What is claimed is:
1. A device, comprising:
    a first electronic component comprising a first magnet configured to produce a first magnetic field;
    a second electronic component comprising a second magnet configured to produce a second magnetic field;
    a case comprising:
        a first charging compartment configured to accommodate and charge the first electronic component,
        a second charging compartment configured to accommodate and charge the second electronic component, and
        a three-dimensional (3D) magnetic field sensor configured to measure at least a first magnetic field component and a second magnetic field component of a magnetic field influenced by the first magnetic field, based on the first electronic component being arranged in proximity to the 3D magnetic field sensor, and influenced by the second magnetic field, based on the second electronic component being arranged in proximity to the 3D magnetic field sensor, wherein the first magnetic field component and second magnetic field component are aligned in perpendicular directions; and
    a detection circuit configured to:
        detect a position of the first electronic component relative to the first charging compartment based on the magnetic field sensed by the 3D magnetic field sensor, and
        detect a position of the second electronic component relative to the second charging compartment based on the magnetic field sensed by the 3D magnetic field sensor,
            wherein the detection circuit is configured to calculate an arctangent function of the first magnetic field component and the second magnetic field component, and detect the position of the first electronic component and the position of the second electronic component based on evaluating the arctangent function relative to one or more arctangent thresholds.

2. The device of claim 1, wherein the detection circuit is further configured to:
    detect an arrangement of the first electronic component or the second electronic component in the at least one of the first charging compartment or the second charging compartment, and
    initiate a charging process of the first electronic component or the second electronic component when the arrangement of the first electronic component or the second electronic component in the at least one of the first charging compartment or the second charging compartment is detected.

3. The device of claim 1, wherein the position of the first electronic component and the position of the second electronic component is detected based on:
    determining that the second magnetic field component exceeds a predetermined threshold; and
    determining whether the arctangent function is positive or negative.

4. The device of claim 1, wherein the position of first electronic component and the position of the second electronic component is detected based on the arctangent function and a derivative of the arctangent function.

5. The device of claim 1, wherein:
    the arctangent function is atan 2(2By,Bx),
    Bx is the first magnetic field component, and
    By is the second magnetic field component.

6. The device of claim 1, further comprising:
    a calculation circuit configured to calculate a 3D magnetic field vector of the magnetic field,
    wherein the detection circuit is further configured to detect the position of the first electronic component and the position of the second electronic component based on the 3D magnetic field vector.

7. The device of claim 1, further comprising:
    a case cover configured to cover an interior of the case; and
    a third magnet in the case cover, the third magnet configured to produce a third magnetic field,
    wherein the detection circuit is further configured to detect a position of the case cover based on a third magnetic field component of the magnetic field, the third magnetic field component being attributed to the third magnetic field.

8. The device of claim 7, wherein the third magnetic field component is linearly independent from the first magnetic field component and the second magnetic field component.

9. The device of claim 7, wherein the detection circuit is further configured to:

detect a closed state or open state of the case cover based on comparing the third magnetic field component with a threshold value.

10. The device of claim 7, wherein, when the first electronic component and the second electronic component are in the first charging compartment and the second charging compartment, respectively, a first magnetization direction of the first magnet is opposite to a second magnetization direction of the second magnet.

11. The device of claim 10, wherein, in a closed state of the case cover, a third magnetization direction of the third magnet is perpendicular to each of the first magnetization direction and the second magnetization direction.

12. The device of claim 1, wherein at least one of the first charging compartment or the second charging compartment is further configured to wirelessly charge at least one of the first electronic component or the second electronic component.

13. The device of claim 1, wherein at least one of the first electronic component or the second electronic component includes a wireless earbud.

14. The device of claim 1, wherein the detection circuit is further configured to:
   adapt a detection threshold value based on at least one of a degradation of the first magnet over time, or a change in a temperature of the device.

15. The device of claim 1, wherein the detection circuit is further configured to:
   calculate a derivative of the arctangent function, and
   detect the position of the first electronic component and the position of the second electronic component based on evaluating a slope of the derivative.

16. The device of claim 1, wherein the detection circuit is further configured to:
   calculate a derivative of the arctangent function, determine whether the derivative is positive or negative, and
   detect the position of the first electronic component and the position of the second electronic component based on the derivative being positive or negative.

17. The device of claim 1, wherein the detection circuit is further configured to:
   detect the position of the first electronic component and the position of the second electronic component based on comparing the second magnetic field component to one or more thresholds.

18. The device of claim 1, wherein the detection circuit is further configured to:
   compare the second magnetic field component to a threshold to determine whether or not the second magnetic field component satisfies the threshold,
   compare the arctangent function to an arctangent threshold to determine whether or not the arctangent function satisfies the arctangent threshold, and
   detect the position of the first electronic component and the position of the second electronic component based on whether or not the second magnetic field component satisfies the threshold, and based on whether or not the arctangent function satisfies the arctangent threshold.

19. The device of claim 1, wherein the detection circuit is further configured to:
   compare the second magnetic field component to a threshold to determine whether or not the second magnetic field component satisfies the threshold,
   determine whether the arctangent function is positive or negative, and
   detect the position of the first electronic component and the position of the second electronic component based on whether or not the second magnetic field component satisfies the threshold, and based on whether the arctangent function is positive or negative.

20. The device of claim 1, wherein the detection circuit is further configured to:
   compare the second magnetic field component to a threshold to determine whether or not the second magnetic field component satisfies the threshold, and
   based on the second magnetic field component satisfying the threshold:
     determine whether the arctangent function is positive or negative,
     based on the arctangent function being positive, determine that the first electronic component is arranged inside the first charging compartment, and that the second electronic component is inserted or getting inserted into the second charging compartment, and
     based on the arctangent function being negative, determine that the second electronic component is arranged inside the second charging compartment, and that the first electronic component is inserted or getting inserted into the first charging compartment.

21. The device of claim 20, wherein the detection circuit is further configured to:
   based on the second magnetic field component not satisfying the threshold:
     calculate a derivative of the arctangent function,
     determine whether the derivative is positive or negative,
     based on the derivative being negative, determine that the first electronic component is arranged outside of the first charging compartment and that the second electronic component is arranged inside of the second charging compartment, and
     based on the derivative being positive, determine that the second electronic component is arranged outside of the second charging compartment and that the first electronic component is arranged inside of the first charging compartment.

22. The device of claim 1, wherein the detection circuit is further configured to:
   compare the arctangent function to an arctangent threshold to determine whether or not the arctangent function satisfies the arctangent threshold, and
   based on the arctangent function satisfying the arctangent threshold:
     calculate a derivative of the arctangent function,
     determine whether the derivative is positive or negative,
     based on the derivative being negative, determine that the first electronic component is arranged outside of the first charging compartment and that the second electronic component is arranged inside of the second charging compartment, and
     based on the derivative being positive, determine that the second electronic component is arranged outside of the second charging compartment and that the first electronic component is arranged inside of the first charging compartment.

23. The device of claim 22, wherein the detection circuit is further configured to:
   based on the arctangent function not satisfying the arctangent threshold:
     determine whether the arctangent function is positive or negative,
     based on the arctangent function being positive, determine that the first electronic component is arranged inside the first charging compartment, and that the second electronic component is inserted or getting inserted into the second charging compartment, and based on the arctangent function being negative, determine that the second electronic component is arranged inside the second charging compartment, and that the first electronic component is inserted or getting inserted into the first charging compartment.

24. A method, comprising:

sensing, by a three-dimensional (3D) magnetic field sensor arranged in a case, a magnetic field produced by:
   a first magnetic field generated by a first magnet included in a first electronic component, and
   a second magnetic field generated by a second magnet included in a second electronic component,
   wherein sensing the magnetic field includes measuring at least a first magnetic field component and a second magnetic field component of the magnetic field that is influenced by the first magnetic field, based on the first electronic component being arranged in proximity to the 3D magnetic field sensor, and influenced by the second magnetic field, based on the second electronic component being arranged in proximity to the 3D magnetic field sensor, and
   wherein the first magnetic field component and second magnetic field component are aligned in perpendicular directions; and detecting a position of the first electronic component, relative to a first charging compartment of the case and configured to accommodate the first electronic component, based on the magnetic field;

detecting a position of the second electronic component, relative to a second charging compartment of the case and configured to accommodate the second electronic component, based on the magnetic field;

calculating an arctangent function of the first magnetic field component and the second magnetic field component; and detecting the position of the first electronic component and the position of the second electronic component based on evaluating the arctangent function relative to one or more arctangent thresholds.

* * * * *